United States Patent
Yen et al.

(10) Patent No.: US 6,900,999 B1
(45) Date of Patent: May 31, 2005

(54) TERNARY CONTENT ADDRESSABLE MEMORY (TCAM) CELLS WITH SMALL FOOTPRINT SIZE AND EFFICIENT LAYOUT ASPECT RATIO

(75) Inventors: Ting-Pwu Yen, Saratoga, CA (US); Kee Park, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 22 days.

(21) Appl. No.: 10/609,756

(22) Filed: Jun. 30, 2003

(51) Int. Cl.[7] .............................................. G11C 15/04
(52) U.S. Cl. ........................................ 365/49; 365/168
(58) Field of Search ...................... 365/49, 168, 154, 365/185.03

(56) References Cited

U.S. PATENT DOCUMENTS

| | | | |
|---|---|---|---|
| 5,699,288 A * | 12/1997 | Kim et al. ..................... 365/49 |
| 6,188,594 B1 | 2/2001 | Ong ............................. 365/49 |
| 6,240,004 B1 * | 5/2001 | Kuo et al. ..................... 365/49 |
| 6,256,216 B1 * | 7/2001 | Lien et al. ..................... 365/49 |
| 6,262,907 B1 | 7/2001 | Lien et al. ..................... 365/49 |
| 6,362,993 B1 | 3/2002 | Henderson et al. ........... 365/49 |
| 6,370,052 B1 | 4/2002 | Hsu et al. ..................... 365/49 |
| 6,374,325 B1 | 4/2002 | Simpson et al. ............ 711/108 |
| 6,385,070 B1 | 5/2002 | Peterson ...................... 365/49 |
| 6,430,073 B1 | 8/2002 | Batson et al. ................. 365/49 |
| 6,480,406 B1 | 11/2002 | Jin et al. ....................... 365/49 |
| 6,496,398 B2 | 12/2002 | Hellner et al. ................ 365/49 |
| 6,515,884 B1 | 2/2003 | Sywyk et al. ................. 365/49 |
| 6,522,562 B2 | 2/2003 | Foss ............................. 365/49 |
| 6,563,727 B1 | 5/2003 | Roth et al. .................... 365/49 |
| 6,760,249 B2 * | 7/2004 | Chien ......................... 365/154 |
| 2002/0141218 A1 | 10/2002 | Foss et al. ..................... 365/49 |
| 2003/0035331 A1 | 2/2003 | Foss et al. ................... 365/200 |

OTHER PUBLICATIONS

Annex to Form PCT/ISA/206, Communication Relating to the Results of the Partial International Search, PCT/US2004/019148, Nov. 24, 2004.

* cited by examiner

*Primary Examiner*—Tan T. Nguyen
(74) *Attorney, Agent, or Firm*—Myers Bigel Sibley & Sajovec (57) ABSTRACT

Ternary CAM cells are provided that have extremely small layout footprint size and efficient layout aspect ratios that enhance scalability. The cells also have high degrees of symmetry that facilitate high yield interconnections to bit, data and match lines. A 16T ternary CAM cell includes first and second pairs of access transistors that extend adjacent a first side of the cell, and first and second pairs of cross-coupled inverters that extend adjacent a second side of the cell. First and second halves of a 4T compare circuit are also provided. The first half of the 4T compare circuit is positioned so that is extends between the first pair of access transistors and the first pair of cross-coupled inverters. Similarly, the second half of the 4T compare circuit is positioned so that it extends between the second pair of access transistors and the second pair of cross-coupled inverters.

56 Claims, 4 Drawing Sheets

TERNARY CONTENT ADDRESSABLE MEMORY (TCAM) CELLS WITH SMALL FOOTPRINT SIZE AND EFFICIENT LAYOUT ASPECT RATIO

FIELD OF THE INVENTION

The present invention relates to integrated circuit memory devices and, more particularly, to content addressable memory (CAM) devices.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry.

The cells within a CAM array are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}..., {1XXX}, {XXXX}. A quaternary CAM cell is different from a ternary CAM cell because it has four valid combinations of states: ((data=0, mask=active), (data=1, mask=active), (data=0, mask=inactive), (data=1, mask=inactive)). Quaternary CAM cells are frequently treated as "ternary" CAM cells because two of the four states represent equivalent active mask conditions when search operations are performed. However, ternary CAM (TCAM) cells and quaternary CAM (QCAM) cells will be treated herein as separate categories of CAM cells.

CAM cells may use a variety of different memory cell technologies, including volatile SRAM and DRAM technologies and nonvolatile memory technologies. CAM cells based on these technologies are disclosed in U.S. Pat. Nos. 6,101,116, 6,128,207, 6,256,216, 6,266,263, 6,373,739 and 6,496,399, assigned to the present assignee, the disclosures of which are hereby incorporated herein by reference. In addition, U.S. Pat. No. 6,522,562 to Foss, entitled "Content Addressable Memory Cell Having Improved Layout," discloses a CAM cell that uses p-channel transistors as SRAM access transistors. These p-channel transistors purportedly improve layout efficiency by providing a balanced number of p-channel and N-channel transistors within each CAM cell. In particular, FIG. 4 of the '562 patent illustrates a CAM half-cell that includes a 6T SRAM cell defined by two PMOS access transistors P3 and P4, two PMOS pull-up transistors P1 and P2 and two NMOS pull-down transistors N1 and N2. One half of a 4T compare circuit is also illustrated as including two NMOS transistors N3 and N4. Unfortunately, because PMOS transistors typically have lower mobility relative to equivalently-sized NMOS transistors, using PMOS transistors as access transistors within an SRAM cell may require relatively large PMOS transistors that increase overall unit cell size.

CAM cells having small unit cell size can also be achieved using lower transistor count dynamic CAM cells. For example, FIG. 5 of U.S. Pat. No. 6,188,594 to Ong, entitled "Reduced-Pitch 6-Transistor NMOS Content-Addressable-Memory Cell," discloses a 6T CAM cell having a non-unity layout aspect ratio.

SUMMARY OF THE INVENTION

Embodiments of the present invention include ternary CAM cells having extremely small layout footprint size and efficient layout aspect ratios that enhance scalability and uniformity of wiring pitch. The ternary CAM cells also have high degrees of symmetry that facilitate extensive sharing of vias between transistor-equivalent half-cells. These shared vias provide electrical interconnects between terminals of the CAM cell transistors and bit, data and match lines. Accordingly, when the CAM half-cells are joined together on all four sides to form a large CAM array, a low per cell via count can be achieved.

First embodiments of the present invention include a 16T SRAM-based ternary CAM cell that extends in a semiconductor substrate and has a substantially square layout aspect ratio. In particular, the CAM cell includes first and second pairs of access transistors that extend adjacent a first side of the ternary CAM cell, and first and second pairs of cross-coupled inverters that extend adjacent a second side of the ternary CAM cell. First and second halves of a 4T compare circuit are also provided. The first half of the 4T compare circuit is positioned so that is extends between the first pair of access transistors and the first pair of cross-coupled inverters. Similarly, the second half of the 4T compare circuit is positioned so that it extends between the second pair of access transistors and the second pair of cross-coupled inverters.

The first pair of cross-coupled inverters include a first inverter having a first PMOS pull-up transistor and a first NMOS pull-down transistor therein, and a second inverter having a second PMOS pull-up transistor and a second NMOS pull-down transistor therein. To facilitate high cell density, the first and second NMOS pull-down transistors are positioned so that they extend between the first and second PMOS pull-up transistors (on one side) and the first half of the 4T compare circuit (on an opposite side). The second pair of cross-coupled inverters include a second pair of PMOS pull-up transistors and a second pair of NMOS pull-down transistors, which extend between the second pair of PMOS pull-up transistors and the second half of the 4T compare circuit.

According to preferred aspects of these embodiments, the first and second pairs of access transistors are equivalently-sized NMOS transistors having a first width/length (W/L) ratio and the 4T compare circuit comprises four equivalently-sized NMOS transistors having a second width/length ratio that is greater than the first width/length ratio. In some embodiments, the first width/length ratio is less than about 1.15 and the second width/length ratio is greater than about 1.15. More preferably, the first width/length ratio is about 1.04 and the second width/length ratio is about 1.25. The first pair of cross-coupled inverters comprises two equivalently-sized NMOS pull-down transistors having a third width/length ratio and two equivalently-sized PMOS pull-up transistors having a fourth width/length ratio that is less than the third width/length ratio. In some embodiments, the third width/length ratio is greater than about 1.5 and the fourth width/length ratio is less than about 1.25. More preferably, the third width/length ratio is about 1.8 and the fourth width/length ratio is about 1.0.

To achieve high degrees of scalability and support relatively uniform horizontal and vertical wiring pitches, a width/height aspect ratio of the ternary CAM cell is approximately square. In some embodiments, the width/height aspect ratio may be in a range from between about 1.08 and about 1.20. High density layouts can also be achieved by placing and orienting the MOS transistors of a CAM cell in orthogonal x and y directions that achieve a high packing density. In particular, a ternary CAM cell can be achieved having a footprint in a range from between about 3.0 $\mu m^2$ and about 3.6 $\mu m^2$.

Ternary CAM cells according to additional embodiments of the present invention include a first pair of NMOS access transistors having source and drain regions that are arranged in a y-direction in a first quadrant of the ternary CAM cell. A second pair of NMOS access transistors are also provided in a second quadrant of the ternary CAM cell and their source and drain regions are also arranged in the y-direction. The ternary CAM cell also includes first and second pairs of cross-coupled inverters that are positioned in fourth and third quadrants, respectively. The first pair of cross-coupled inverters comprises two PMOS pull-up transistors and two NMOS pull-down transistors that are arranged in an x-direction, which is orthogonal to the y-direction. Similarly, the second pair of cross-coupled inverters comprises two PMOS pull-up transistors and two NMOS pull-down transistors that are arranged in the x-direction. The ternary CAM cell also includes a 4T compare circuit that is divided into two halves. A first half of the 4T compare circuit is positioned between the first pair of access transistors and the first pair of cross-coupled inverters, and comprises two NMOS transistors that are arranged in the x-direction. Similarly, the second half of the 4T compare circuit is positioned between the second pair of access transistors and the second pair of cross-coupled inverters, and comprises two NMOS transistors arranged in the x-direction.

Many additional embodiments of the present invention are also provided, as described further herein.

DETAILED DESCRIPTION OF PREFERRED EMBODIMENTS

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 1A:
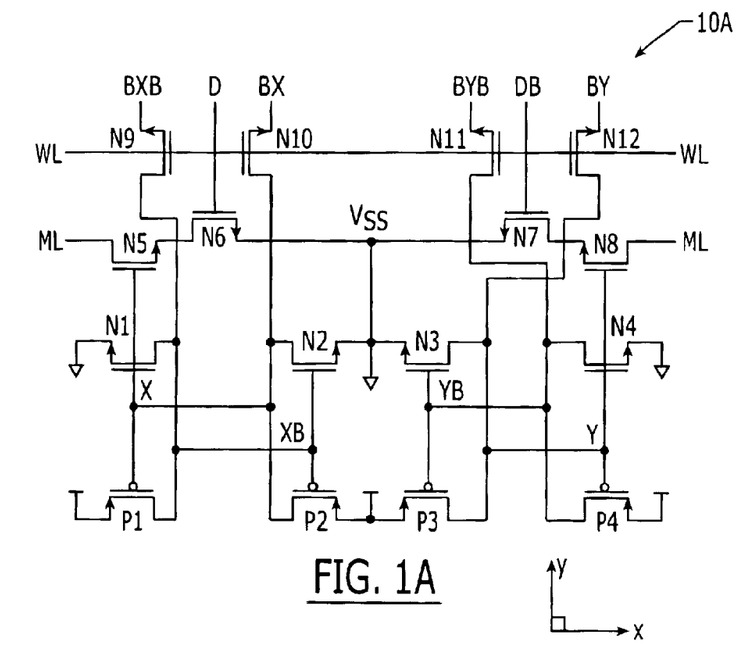
FIG. 1A is an electrical schematic of a ternary CAM cell according to an embodiment of the present invention.

Referring now to FIG. 1A, an electrical schematic of a ternary CAM cell 10A according to an embodiment of the present invention will be described. The ternary CAM cell 10A represents a sixteen transistor (16T) ternary CAM cell having two SRAM cells and a four transistor (4T) compare circuit therein. Each SRAM cell includes two access transistors and one pair of cross-coupled inverters that operate as a storage element. On the left side of FIG. 1A, a left half of the ternary CAM cell 10A is illustrated. This left half includes an X-SRAM storage element that generates an X output, which is provided to a left half of the 4T compare circuit. The X-SRAM storage element is defined by a first inverter, which consists of PMOS pull-up transistor P1 and NMOS pull-down transistor N1, and a second inverter, which consists of PMOS pull-up transistor P2 and NMOS pull-down transistor N2. The input of the first inverter is designated by the label X and the input of the second inverter is designated by the complementary label XB.

The input X of the first inverter is electrically connected to a first current carrying terminal of an NMOS access transistor N10. This first current carrying terminal of the NMOS access transistor N10 is illustrated as a drain terminal. The NMOS access transistor N10 has a gate terminal that is responsive to a word line signal WL and a second current carrying terminal that is responsive to a true bit line signal (shown as BX). The input XB of the second inverter is electrically connected to a first current carrying terminal of an NMOS access transistor N9. The NMOS access transistor N9 has a gate terminal that is responsive to the word line signal WL and a second current carrying terminal that is responsive to a complementary bit line signal (shown as BXB). The left half of the 4T compare circuit is defined by NMOS transistors N5 and N6, which are connected in series (i.e., source-to-drain) between a match line (ML) and a ground reference line (Vss). NMOS transistor N5 is configured to receive the signal X, which is the output of the second inverter defined by PMOS pull-up transistor P2 and NMOS pull-down transistor N2. NMOS transistor N6 is configured to receive a true data signal (shown as D), which represents the true bit of a comparand that is applied to the ternary CAM cell 10A during a search operation.

The right halt of the ternary CAM cell 10A includes a Y-SRAM storage element that generates an output to a right half of the 4T compare circuit. The Y-SRAM storage element is defined by a third inverter, which consists of PMOS pull-up transistor P3 and NMOS pull-down transistor N3, and a fourth inverter, which consists of PMOS pull-up transistor P4 and NMOS pull-down transistor N4. The input of the fourth inverter is designated by the label Y and the input of the third inverter is designated by the label YB. The input Y of the fourth inverter is electrically connected to a first current carrying terminal of NMOS access transistor N12. The NMOS access transistor N12 has a gate terminal that is responsive to the word line signal WL and a second current carrying terminal that is responsive to a true bit line signal (shown as BY).

The input YB of the third inverter is electrically connected to a first current carrying terminal of NMOS access transistor N11. The NMOS access transistor N11 has a gate terminal that is responsive to the word line signal WL and a second current carrying terminal that is responsive to a complementary bit line signal (shown as BYB). The right half of the 4T compare circuit is defined by NMOS transistors N7 and N8, which are connected in series (i.e., source-to-drain) between a match line (ML) and a ground reference line (Vss). NMOS transistor N8 is configured to receive the signal Y, which is the output of the third inverter defined by PMOS pull-up transistor P3 and NMOS pull-down transistor N3. NMOS transistor N7 is configured to receive a complementary data signal (shown as DB), which represents the complementary bit of the aforementioned comparand.

Based on the illustrated configuration of the transistors and interconnections within the cell embodiment of FIG. 1A, the ternary CAM cell 10A is configured to support three valid states in accordance with TABLE 1:

TABLE 1

| X | Y | STATE |
|---|---|-------|
| 0 | 0 | MASK |
| 0 | 1 | 0 |
| 1 | 0 | 1 |
| 1 | 1 | INVALID |

Similarly, by reversing the positions of the differential data lines (D and the DB) within the CAM cell 10A will support the three valid states illustrated by TABLE 2:

TABLE 2

| X | Y | STATE |
|---|---|-------|
| 0 | 0 | MASK |
| 0 | 1 | 1 |
| 1 | 0 | 0 |
| 1 | 1 | INVALID |

Figure 1B:
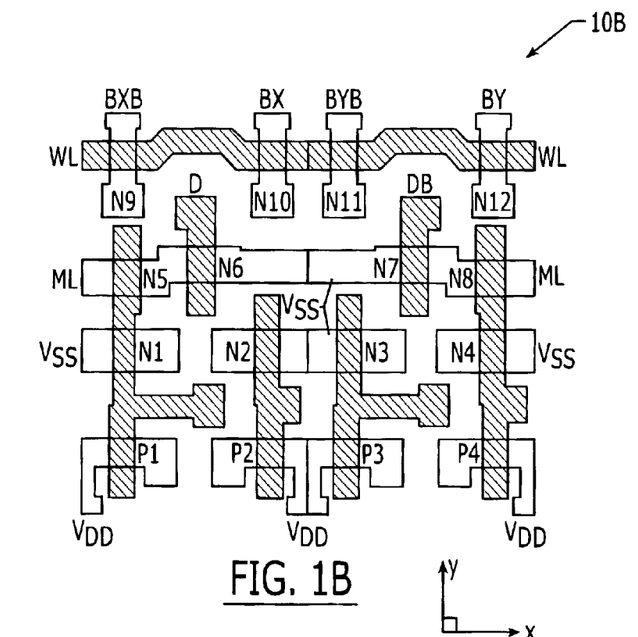
FIG. 1B is a layout schematic of the ternary CAM cell of FIG. 1A. The left-to-right and top-to-bottom orientation of the MOS transistors in the layout schematic match the orientation of the MOS transistors in the electrical schematic of FIG. 1A.

The electrical schematic of the ternary CAM cell 10A illustrated by FIG. 1A corresponds to the layout schematic of the ternary CAM cell 10B illustrated by FIG. 1B. Thus in FIG. 1A, the lateral (left-to-right) orientation of PMOS pull-up transistors P1–P4 and NMOS transistors N1–N8 represents the lateral x-direction orientation of the PMOS pull-up transistors P1–P4 and the NMOS transistors N1–N8 illustrated by FIG. 1B. Likewise, the vertical (top-to-bottom) orientation of NMOS access transistors N9–N12 represents the vertical y-direction orientation of the NMOS access transistors N9–N12 illustrated by FIG. 1B. As will be understood by those skilled in the art, the open (i.e., unshaded) polygons in the layout of FIG. 1B represent source/drain diffusion patterns and the shaded polygons represent gate "poly" patterns (i.e., polysilicon patterns). Thus, in FIG. 1B, the source-to-drain direction (i.e., channel length direction) of the PMOS pull-up transistors P1–P4 and the NMOS transistors N1–N8 corresponds to the x-direction and the source-to-drain direction of the NMOS access transistors N9–N12 corresponds to the y-direction.

In the ternary CAM cell 10B, the gate poly patterns associated with PMOS pull-up transistor P1, NMOS pull-down transistor N1 and NMOS transistor N5 are joined into one contiguous pattern, to represent a portion of the signal line X in FIG. 1A. Similarly, the contiguous gate poly pattern associated with PMOS pull-up transistor P2 and NMOS pull-down transistor N2 represents a portion of the signal line XB in FIG. 1A. The contiguous gate poly pattern associated with PMOS pull-up transistor P3 and NMOS pull-down transistor N3 represents a portion of the signal line YB in FIG. 1A. The contiguous gate poly pattern associated with PMOS pull-up transistor P4 and NMOS pull-down transistor N4 represents a portion of the signal line Y in FIG. 1A. The gate poly patterns associated with NMOS transistor N6 and NMOS transistor N7 represent portions of the true and complementary connections to the true data line D and the complementary data line DB, respectively. The single gate poly pattern that extends laterally across the top side of the ternary CAM cell 10B represents a word line (WL).

The reference labels BXB, BX, BYB and BY, which run along the top side of the ternary CAM cell 10B, represent the source regions of access transistors that are electrically connected (by vias) to two pairs of differential bit lines. The reference labels ML represents the drain regions of two NMOS transistors N5 and N8 that are electrically connected (by vias) to a match line (not shown), which is typically formed at a higher level of metallization. The reference labels Vss represent the source regions of NMOS transistors N1–N4 and N6–N7, which are electrically connected (by vias) to a ground reference line. Finally, the reference labels Vdd represent the drain regions of PMOS pull-up transistors P1–P4, which are electrically connected (by vias) to a power supply line (e.g., Vdd=1 Volt).

Figure 1C:
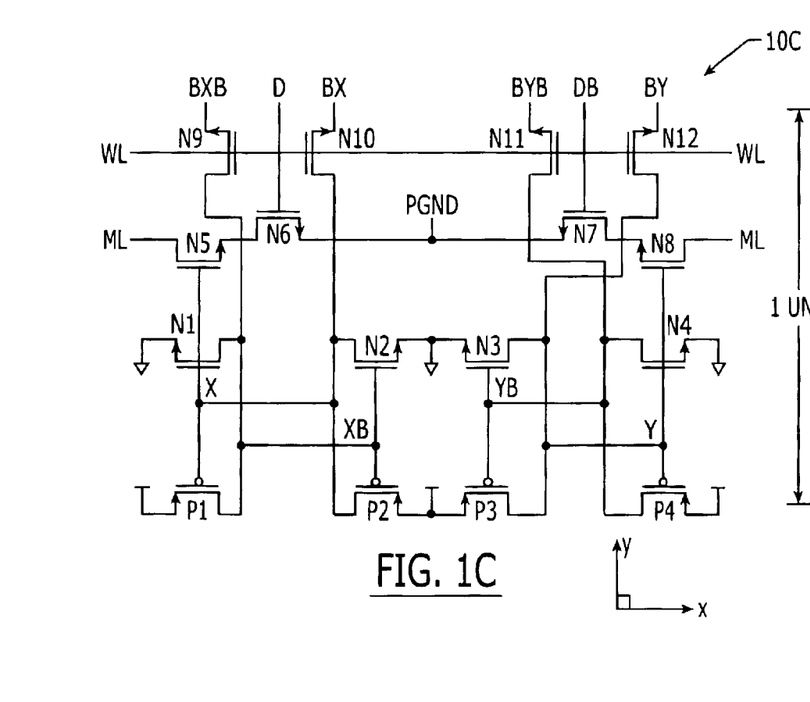
FIG. 1C is an electrical schematic of a ternary CAM cell that is similar to the embodiment of FIG. 1A, however, a pseudo-ground (PGND) connection is provided.

Referring now to FIG. 1C, a 16T ternary CAM cell 10C according to another embodiment of the present invention is illustrated. This CAM cell 10C is essentially identical to the ternary CAM cell 10A of FIG. 1A, however, the source terminals of NMOS transistors N6 and N7 within the 4T compare circuit are connected to a switchable pseudo-ground line (PGND), instead of a fixed ground reference line (Vss). The use of switchable pseudo-ground lines to enhance performance of ternary CAM arrays in certain applications is more fully described in U.S. application Ser. Nos. 10/0084,842 to Lien et al., filed Feb. 27, 2002; Ser. No. 10/306,799 to Lien et al., filed Nov. 27, 2002; and Ser. No. 10/323,236 to Park et al., filed Dec. 18, 2002, the disclosures of which are hereby incorporated herein by reference.

Figure 1D:
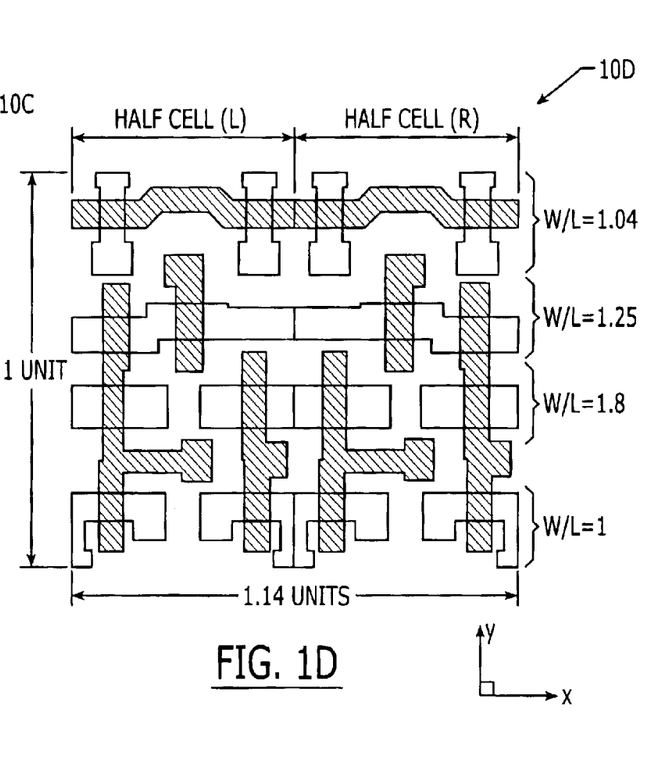
FIG. 1D is a layout schematic of the ternary CAM cell of FIG. 1B, with layout aspect ratio and transistor size information provided.

As illustrated by the ternary CAM cell 10D of FIG. 1D, the layout of the CAM cell of FIGS. 1A–1B includes two half-cells, left and right. These two half-cells have equivalent transistor count and the source/drain diffusion regions of these half-cells are mirror images of each other. As illustrated more fully by FIG. 1F, these half-cells may be replicated side-by-side in an alternating left/right half-cell sequence to form a row of CAM cells (e.g., a x80 row). Moreover, the CAM cell 10D of FIG. 1D and a mirror image of this cell when rotated about the x-axis, will result in a pair of cells that may be replicated side-by-side to define two adjacent rows of CAM cells within a CAM array. These two adjacent rows of CAM cells may be stacked vertically to define an array having a large number of rows and columns of CAM cells 10D therein.

FIG. 1D also illustrates how the layout of the ternary CAM cells 10A–10D results in a width-to-height layout aspect ratio that is substantially square. In particular, in order to enhance scalability and uniformity of wiring pitch (in both x and y directions), it is preferred that the width/height aspect ratio be in a range from between about 1.08 and about 1.20 and, more preferably, about 1.14. Factors which influence the aspect ratio include the placement, size and orientation of the sixteen transistors within a cell. As described more fully hereinbelow, the placement and orientation is chosen so that the resulting CAM cell has essentially identical left and right half-cells. These half-cells may share all ML, Vss and Vdd vias with adjacent half-cells in a same row of a CAM array, and also share all bit line and data line vias (e.g., BXB, BX, BYB, BY, D and DB) with adjoining cells in a same column of the CAM array. Moreover, using deep sub-micron CMOS processes, including the Nexsys™ 90-nanometer process technology developed by Taiwan Semiconductor Manufacturing Company, Ltd., a small layout footprint in a range from between about 3.0 $\mu m^2$ and about 3.6 $\mu m^2$ can be achieved for the CAM cells illustrated herein. This 90-nanometer process technology supports a core supply voltage (Vdd) ranging from 1.0 Volts to 1.2 Volts with an I/O and analog block supply voltage ranging from 1.8 Volts to 3.3 Volts.

The sixteen transistors within the ternary CAM cell 10D are also sized to achieve preferred operating characteristics including high soft-error immunity characteristics. A proper balance is also struck between the contribution of each cell to the bit line, data line and match line capacitance and cell speed. One significant design consideration is the speed/power tradeoff between the match line pull-down strength of each cell and its contribution to match line capacitance, which is a significant consumer of match line power during search operations. To achieve a proper balance of these and other design parameters, the first and second pairs of access transistors are equivalently-sized NMOS transistors and the NMOS transistors within the 4T compare circuit are also equivalently-sized. More particularly, the first and second pairs of access transistors N9–N10 and N11–N12 are equivalently-sized NMOS transistors having a first width/length (W/L) ratio. The 4T compare circuit comprises four equivalently-sized NMOS transistors N5–N8 having a second width/length ratio that is greater than the first width/length ratio. It is preferable that the first width/length ratio be less than about 1.15 and the second width/length ratio be greater than about 1.15. More preferably, the first width/length ratio is about 1.04 and the second width/length ratio is about 1.25, as illustrated by FIG. 1D.

The first and second pairs of cross-coupled inverters are also configured to have equivalently-sized NMOS pull-down transistors N1–N2 and N3–N4 having a third width/length ratio, and equivalently-sized PMOS pull-up transistors P1–P2 and P3–P4 having a fourth width/length ratio. The third width/length ratio is greater than the fourth width/length ratio. It is preferable that the third width/length ratio is greater than about 1.5 and the fourth width/length ratio is less than about 1.25. More preferably, the third width/length ratio is about 1.8 and the fourth width/length ratio is about 1.0, as illustrated by FIG. 1D.

Figure 1E:
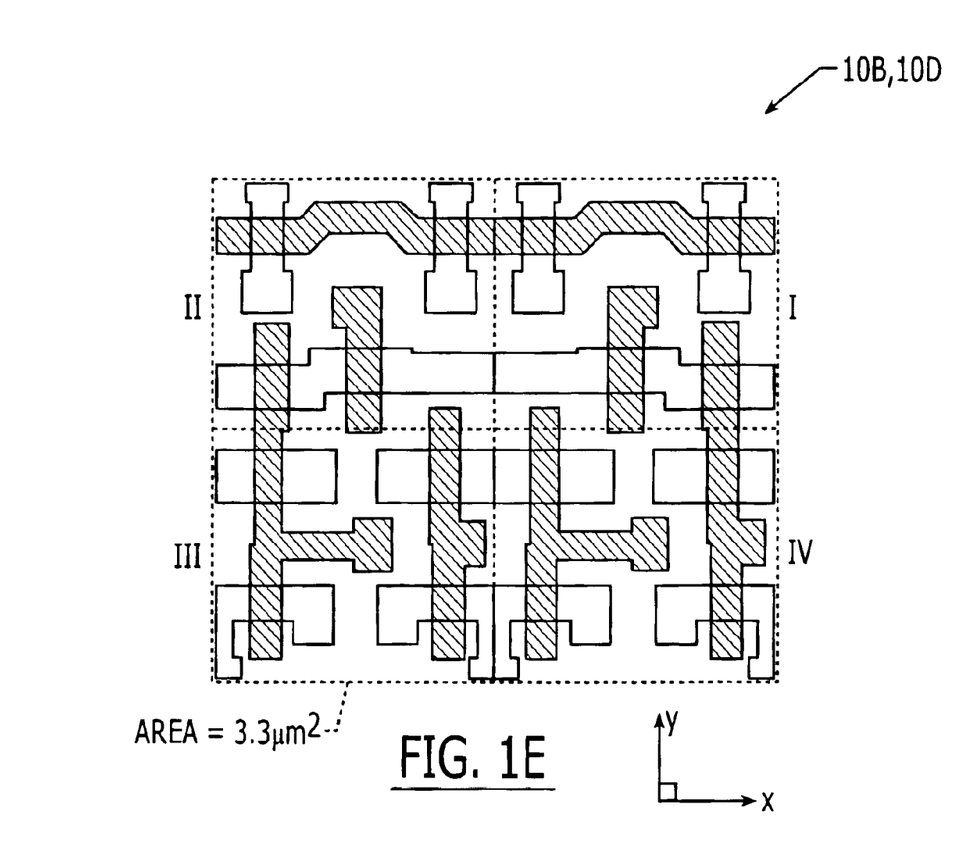
FIG. 1E is a layout schematic of the ternary CAM cells of FIGS. 1B and 1D, with dotted lines that show the positions of various transistors within four quadrants of a substantially square CAM cell.

Referring now to FIG. 1E, the layout patterns of the CAM cells 10B and 10D illustrated by FIGS. 1B and 1D are shown as being divided into four quadrants, I–IV, which occupy a layout footprint of 3.3 $\mu m^2$. Quadrant I is illustrated as including the right pair of access transistors and the right half of the 4T compare circuit. Similarly, Quadrant II is illustrated as including the left pair of access transistors and the left half of the 4T compare circuit. Quadrant IV is illustrated as including two cross-coupled inverters, which define a storage element within an SRAM cell. These two cross-coupled inverters are defined by two NMOS pull-down transistors and two PMOS pull-up transistors, shown as N3–N4 and P3–P4 in FIGS. 1A–1C. Similarly, Quadrant III is illustrated as including two cross-coupled inverters, which comprise two NMOS pull-down transistors and two PMOS pull-up transistors, shown as N1–N2 and P1–P2 in FIGS. 1A–1C. Thus, each quadrant of the CAM cell 10B, 10D illustrated by FIG. 1E contains an equivalent number of transistors.

Figure 1F:
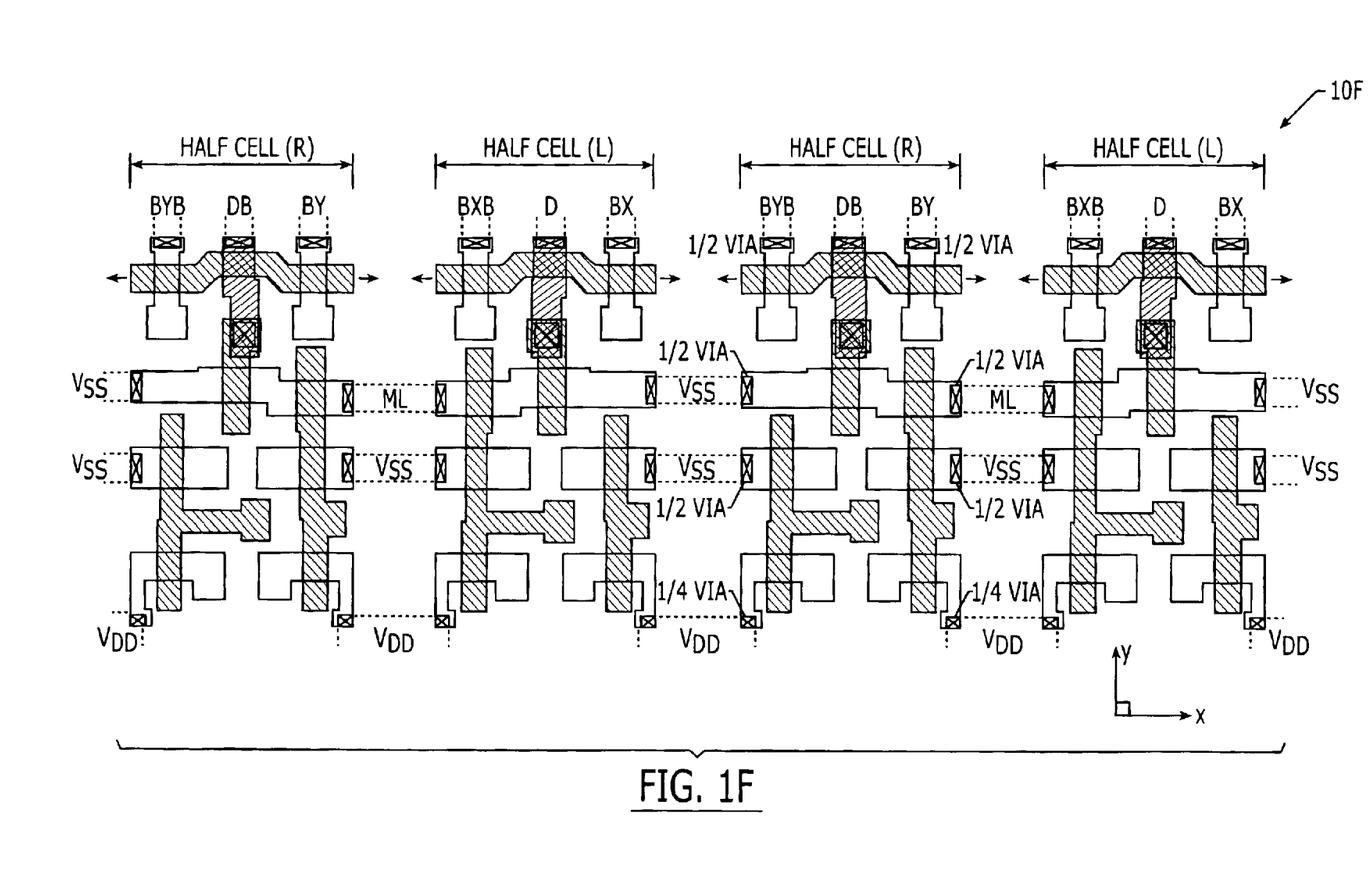
FIG. 1F is a separated layout view of four half-cells with half-via and quarter-via patterns illustrated.

In FIG. 1F, two pairs of CAM half-cells that are arranged within a row of a CAM array are identified by the reference numeral 10F. These half-cells are similar to those illustrated by FIG. 1D, however, numerous via connection patterns have been added to highlight the extensive via sharing between adjacent half-cells in both the x and y directions, when the half-cells are joined together to define a two-dimensional array of CAM cells. These via connections may illustrate: CO contact holes from first level metallization (M1) to the poly gate patterns or source/drain diffusion patterns, VIA1 holes connecting the first level metallization to second level metallization (M2) (not shown) or VIA2 holes connection the second level metallization to third level metallization (not shown). For example, the poly gates of NMOS transistors N6 and N7, which are illustrated by the reference labels D and DB in FIG. 1B, are illustrated as being connected through CO contact holes to respective first level metallization patterns that have been added to FIG. 1F. These first level metallization patterns are are shaded in the reverse direction relative to the poly gate patterns. Moreover, according to preferred aspects of these half-cell layouts, the via connections to power supply lines (Vdd), ground reference lines (Vss), match lines (ML), and bit and data lines (shown as BYB, BY, BXB, BX, D and DB) are positioned along the outer periphery of each half-cell in order to achieve high degrees of via sharing (½ Via or ¼ Via) between adjacent half-cells in both the x and y directions. This high degree of via sharing contributes to a smaller layout footprint having a substantially square aspect ratio.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a semiconductor substrate; and
   a 16T SRAM-based ternary CAM cell in said semiconductor substrate, said ternary CAM cell comprising:
   first and second pairs of access transistors extending adjacent a first side of the ternary CAM cell;
   first and second pairs of cross-coupled inverters extending adjacent a second side of the ternary CAM cell;

a first half of a 4T compare circuit extending between said first pair of access transistors and said first pair of cross-coupled inverters; and a second half of the 4T compare circuit extending between said second pair of access transistors and said second pair of cross-coupled inverters.

2. The device of claim 1, wherein said first pair of cross-coupled inverters comprises:

a first pair of PMOS pull-up transistors; and a first pair of NMOS pull-down transistors that extend between said first pair of PMOS pull-up transistors and said first half of a 4T compare circuit.

3. The device of claim 2, wherein said second pair of cross-coupled inverters comprises:

a second pair of PMOS pull-up transistors; and a second pair of NMOS pull-down transistors that extend between said second pair of PMOS pull-up transistors and said second halt of the 4T compare circuit.

4. The device of claim 1, wherein said ternary CAM cell is a symmetric cell having transistor-equivalent half-cells.

5. The device of claim 4, wherein said ternary CAM cell is configured to support three valid states, including only one mask state.

6. The device of claim 4, wherein a width/height aspect ratio of said ternary CAM cell in said semiconductor substrate is in a range from between about 1.08 and about 1.20.

7. The device of claim 6, wherein a footprint of said ternary CAM cell is in a range from between about 3.0 $\mu m^2$ and about 3.6 $\mu m^2$.

8. The device of claim 1, wherein said first and second pairs of access transistors are equivalently-sized NMOS transistors; and wherein the 4T compare circuit comprises four equivalently-sized NMOS transistors.

9. The device of claim 1, wherein said ternary CAM cell is configured to support three valid states, including only one mask state.

10. The device of claim 9, wherein said ternary CAM cell is an XY CAM cell that supports the following truth table:

| X | Y | STATE |
|---|---|---|
| 0 | 0 | MASK |
| 0 | 1 | 0 (or 1) |
| 1 | 0 | 1 (or 0) |
| 1 | 1 | INVALID. |

11. The device of claim 1, wherein said first and second pairs of access transistors are equivalently-sized NMOS transistors having a first width/length ratio; and wherein the 4T compare circuit comprises four equivalently-sized NMOS transistors having a second width/length ratio that is greater than the first width/length ratio.

12. The device of claim 11, wherein the first width/length ratio is less than about 1.15 and the second width/length ratio is greater than about 1.15.

13. The device of claim 12, wherein said first pair of cross-coupled inverters comprises two equivalently-sized NMOS pull-down transistors having a third width/length ratio and two equivalently-sized PMOS pull-up transistors having a fourth width/length ratio.

14. The device of claim 13, wherein the third width/length ratio is greater than the fourth width/length ratio.

15. The device of claim 14, wherein the third width/length ratio is greater than about 1.5 and the fourth width/length ratio is less than about 1.25.

16. The device of claim 15, wherein the third width/length ratio is about 1.8 and the fourth width/length ratio is about 1.0.

17. The device of claim 11, wherein the first width/length ratio is about 1.04 and the second width/length ratio is about 1.25.

18. The device of claim 1, wherein said first pair of cross-coupled inverters comprises two equivalently-sized NMOS pull-down transistors having a third width/length ratio and two equivalently-sized PMOS pull-up transistors having a fourth width/length ratio.

19. The device of claim 18, wherein the third width/length ratio is greater than the fourth width/length ratio.

20. The device of claim 19, wherein the third width/length ratio is greater than about 1.5 and the fourth width/length ratio is less than about 1.25.

21. The device of claim 20, wherein the third width/length ratio is about 1.8 and the fourth width/length ratio is about 1.0.

22. An integrated circuit device, comprising:

a semiconductor substrate; and a ternary CAM cell in said semiconductor substrate, said ternary CAM cell comprising:

a first pair of access transistors in a first quadrant of said ternary CAM cell;

a second pair of access transistors in a second quadrant of said ternary CAM cell;

a first pair of cross-coupled inverters in a fourth quadrant of said ternary CAM cell;

a second pair of cross-coupled inverters in a third quadrant of said ternary CAM cell;

a first half of a 4T compare circuit between said first pair of access transistors and said first pair of cross-coupled inverters; and a second half of the 4T compare circuit between said second pair of access transistors and said second pair of cross-coupled inverters.

23. The device of claim 22, wherein said ternary CAM cell is a symmetric cell having transistor-equivalent half-cells.

24. The device of claim 23, wherein said ternary CAM cell is configured to support three valid states, including only one mask state.

25. The device of claim 22, wherein said first and second pairs of access transistors are equivalently-sized NMOS transistors; and wherein the 4T compare circuit comprises four equivalently-sized NMOS transistors.

26. The device of claim 25, wherein said first and second pairs of access transistors are equivalently-sized NMOS transistors having a first width/length ratio; and wherein the 4T compare circuit comprises four equivalently-sized NMOS transistors having a second width/length ratio that is greater than the first width/length ratio.

27. The device of claim 26, wherein the first width/length ratio is less than about 1.15 and the second width/length ratio is greater than about 1.15.

28. The device of claim 26, wherein said first pair of cross-coupled inverters comprises two equivalently-sized NMOS pull-down transistors having a third width/length ratio and two equivalently-sized PMOS pull-up transistors having a fourth width/length ratio that is less than the third width/length ratio.

29. The device of claim 28, wherein the first width/length ratio is less than about 1.15, the second width/length ratio is greater than about 1.15, the third width/length ratio is greater than about 1.5 and the fourth width/length ratio is less than about 1.25.

30. An integrated circuit device, comprising:
a semiconductor substrate; and
a ternary CAM cell in said semiconductor substrate, said ternary CAM cell comprising:
first and second pairs of access transistors extending side-by-side in said semiconductor substrate;
first and second pairs of cross-coupled inverters extending side-by-side in said semiconductor substrate;
a first half of a compare circuit extending between said first pair of access transistors and said first pair of cross-coupled inverters; and
a second half of the compare circuit extending between said second pair of access transistors and said second pair of cross-coupled inverters.

31. The device of claim 30, wherein said ternary CAM cell is configured to support three valid states, including only one mask state.

32. The device of claim 31, wherein said ternary CAM cell is an XY CAM cell that supports the following truth table:

| X | Y | STATE |
|---|---|-------|
| 0 | 0 | MASK |
| 0 | 1 | 0 (or 1) |
| 1 | 0 | 1 (or 0) |
| 1 | 1 | INVALID. |

33. The device of claim 30, wherein said ternary CAM cell is a symmetric cell having transistor-equivalent half-cells.

34. The device of claim 30, wherein a width/height aspect ratio of said ternary CAM cell in said semiconductor substrate is in a range from between about 1.08 and about 1.20.

35. The device of claim 34, wherein a footprint of said ternary CAM cell is in a range from between about 3.0 $\mu m^2$ and about 3.6 $\mu m^2$.

36. An integrated circuit device, comprising:
a semiconductor substrate; and
an SRAM-based ternary CAM cell in said semiconductor substrate, said ternary CAM cell comprising:
a plurality of NMOS access transistors positioned side-by-side in said semiconductor substrate;
a pair of data storage elements that are positioned side-by-side in said semiconductor substrate and are electrically connected to current carrying terminals of said plurality of access transistors; and
a compare circuit that is positioned between said plurality of access transistors and said pair of data storage elements.

37. The device of claim 36, wherein a width/height aspect ratio of said ternary CAM cell in said semiconductor substrate is in a range from between about 1.08 and about 1.20.

38. The device of claim 37, wherein a footprint of said ternary CAM cell is in a range from between about 3.0 $\mu m^2$ and about 3.6 $\mu m^2$.

39. An integrated circuit device, comprising:
a semiconductor substrate; and
a 16T SRAM-based XY ternary CAM cell in said semiconductor substrate, said ternary CAM cell having width/height aspect ratio in a range from between about 1.08 and about 1.20 and a footprint in a range from between about 3.0 $\mu m^2$ and about 3.6 $\mu m^2$.

40. The device of claim 39, wherein said ternary CAM cell comprises an X SRAM cell, a Y SRAM cell and a 4T compare circuit, which are configured to support three valid states in accordance with the following truth table:

| X | Y | STATE |
|---|---|-------|
| 0 | 0 | MASK |
| 0 | 1 | 0 (or 1) |
| 1 | 0 | 1 (or 0) |
| 1 | 1 | INVALID. |

41. The device of claim 39, wherein said ternary CAM cell comprises four PMOS transistors and twelve NMOS transistors.

42. An integrated circuit device, comprising:
a semiconductor substrate; and
a ternary CAM cell in said semiconductor substrate, said ternary CAM cell comprising:
a first pair of NMOS access transistors arranged in a y-direction in a first quadrant of said ternary CAM cell;
a second pair of NMOS access transistors arranged in the y-direction in a second quadrant of said ternary CAM cell;
a first pair of cross-coupled inverters positioned in a fourth quadrant of said ternary CAM cell, said first pair of cross-coupled inverters comprising two PMOS pull-up transistors and two NMOS pull-down transistors that are arranged in an x-direction;
a second pair of cross-coupled inverters positioned in a third quadrant of said ternary CAM cell, said second pair of cross-coupled inverters comprising two PMOS pull-up transistors and two NMOS pull-down transistors that are arranged in the x-direction;
a first half of a 4T compare circuit positioned between said first pair of access transistors and said first pair of cross-coupled inverters, and comprising two NMOS transistors arranged in the x-direction; and
a second half of the 4T compare circuit positioned between said second pair of access transistors and said second pair of cross-coupled inverters, and comprising two NMOS transistors arranged in the x-direction.

43. The device of claim 42, wherein a layout of source/drain diffusion patterns in the first and fourth quadrants is a mirror-image to a layout of source/drain patterns in the second and third quadrants.

44. The device of claim 42, wherein said ternary CAM cell has a width/height aspect ratio in a range from between about 1.08 and about 1.20 and a footprint in a range from between about 3.0 $\mu m^2$ and about 3.6 $\mu m^2$.

45. An integrated circuit device, comprising:
a semiconductor substrate; and
an SRAM-based ternary CAM cell in said semiconductor substrate, said ternary CAM cell comprising:
four NMOS access transistors positioned side-by-side in said semiconductor substrate;
a pair of data storage elements that are positioned side-by-side in said semiconductor substrate and are electrically connected to current carrying terminals of said four NMOS access transistors; and
a 4T NMOS-based compare circuit that is positioned between said four NMOS access transistors and said pair of data storage elements.

46. The device of claim 45, wherein a width/height aspect ratio of said ternary CAM cell in said semiconductor substrate is in a range from between about 1.08 and about 1.20;

and wherein a footprint of said ternary CAM cell is in a range from between about 3.0 $\mu m^2$ and about 3.6 $\mu m^2$.

47. An integrated circuit device, comprising:
a semiconductor substrate; and
a ternary CAM half-cell in said semiconductor substrate, said ternary CAM half-cell comprising:
    a first pair of NMOS access transistors positioned adjacent a first side of said CAM half-cell;
    a first pair of cross-coupled inverters positioned adjacent a second side of said CAM half-cell, said first pair of cross-coupled inverters comprising first and second PMOS pull-up transistors and first and second NMOS pull-down transistors;
    a first half of a 4T compare circuit positioned between said first pair of NMOS access transistors and said first pair of cross-coupled inverters;
    a first Vdd quarter-via associated with a source of the first PMOS pull-up transistor;
    a second Vdd quarter-via associated with a source of the second PMOS pull-up transistor,
    a first Vss half-via associated with a source of the first NMOS pull-down transistor;
    a second Vss half-via associated with a source of the second NMOS pull-down transistor;
    a first BL half-via associated with a current carrying terminal of a first one of said first pair of NMOS access transistors; and
    a second BL half-via associated with a current carrying terminal of a second one of said first pair of NMOS access transistors.

48. An integrated circuit device, comprising:
a semiconductor substrate; and
an SRAM-based CAM cell in said semiconductor substrate, said CAM cell having right and left transistor-equivalent half-cells with respective match line half-vias that are joined as a full match line via when the right and left half-cells are positioned side-by-side in said semiconductor substrate.

49. The device of claim 48, wherein all bit line vias associated with the right and left half-cells are half-vias.

50. The device of claim 48, wherein all Vss vias associated with the right and left half-cells are half-vias.

51. The device of claim 48, wherein all M1-to-M2 data line vias associated with the right and left half-cells are half-vias.

52. The device of claim 48, wherein all Vdd vias associated with the right and left half-cells are quarter-vias.

53. The device of claim 48, wherein said SRAM-based CAM cell is a ternary CAM cell.

54. An integrated circuit device, comprising:
a semiconductor substrate; and
a 16T SRAM-based ternary CAM cell in said semiconductor substrate, said ternary CAM cell comprising:
    left and right halves of a 4T compare circuit having transistors therein that are arranged in an x-direction;
    left and right pairs of cross-coupled inverters having pull-down and pull-up transistors therein that are arranged in the x-direction; and
    left and right pairs of access transistors that are arranged in a y-direction and electrically connected to said left and right pairs of cross-coupled inverters wherein said ternary CAM cell has a width/length aspect ratio in a range from between about 1.08 and about 1.20.

55. The device of claim 54, wherein the left and right pairs of access transistors are NMOS transistors having N-type source/drain regions that are configured to adjoin N-type source/drain regions of left and right pairs of access transistors within another CAM cell that is a mirror-image of said ternary CAM cell about an x-axis.

56. The device of claim 54, wherein said pull-up transistors are PMOS transistors having P-type source/drain regions that are configured to adjoin P-type source and drain regions of PMOS pull-up transistors within another CAM cell that is a mirror-image of said ternary CAM cell about an x-axis.

* * * * *